(12) United States Patent
Ohsumi et al.

(10) Patent No.: US 8,578,601 B2
(45) Date of Patent: Nov. 12, 2013

(54) METHOD OF MANUFACTURING PRINTED CIRCUIT BOARD

(75) Inventors: Kohichi Ohsumi, Yasu (JP); Kazunori Hayashi, Yasu (JP); Tomoharu Tsuchida, Yasu (JP)

(73) Assignee: Kyocera SLC Technologies Corporation, Shiga (JP)

( * ) Notice: Subject to any disclaimer, the term of this patent is extended or adjusted under 35 U.S.C. 154(b) by 149 days.

(21) Appl. No.: 13/400,809

(22) Filed: Feb. 21, 2012

(65) Prior Publication Data
US 2012/0145665 A1 Jun. 14, 2012

(51) Int. Cl.
*H01K 3/10* (2006.01)
(52) U.S. Cl.
USPC .......... 29/852; 29/825; 29/830; 29/846; 427/97.2
(58) Field of Classification Search
USPC .......... 29/825, 830, 846, 852; 427/97.2
See application file for complete search history.

(56) References Cited

U.S. PATENT DOCUMENTS

| | | | | |
|---|---|---|---|---|
| 4,755,551 | A * | 7/1988 | Nakano et al. | 524/430 |
| 5,252,195 | A * | 10/1993 | Kobayashi et al. | 205/126 |
| 5,817,405 | A * | 10/1998 | Bhatt et al. | 428/209 |
| 6,039,889 | A * | 3/2000 | Zhang et al. | 216/17 |
| 2007/0130761 | A1* | 6/2007 | Kang et al. | 29/830 |
| 2009/0236137 | A1* | 9/2009 | Kaneda et al. | 174/262 |

FOREIGN PATENT DOCUMENTS

JP 2002-043752 A 2/2002

\* cited by examiner

*Primary Examiner* — Carl Arbes
(74) *Attorney, Agent, or Firm* — Keating & Bennett, LLP

(57) ABSTRACT

A method of manufacturing a printed circuit board includes forming a through hole 2 in an insulating layer 1 having upper and lower faces so as to penetrate between the upper and lower surfaces; allowing a first plated conductor 4 to be deposited at least in the through hole 2 and on the upper and lower surfaces around the through hole; removing the first plated conductor overlying and underlying a periphery of the through hole by etching the first plated conductor 4, while leaving at least the first plated conductor 4 in a mid-portion in a vertical direction within the through hole 2; and forming by semi-additive method a second plated conductor 6 that fills an outer portion than the first plated conductor 4 in the through hole 2, and forms a wiring conductor on the upper and lower surfaces.

8 Claims, 6 Drawing Sheets

METHOD OF MANUFACTURING PRINTED CIRCUIT BOARD

TECHNICAL FIELD

The present invention relates to a method of manufacturing a printed circuit board.

BACKGROUND ART

As a thin type printed circuit board, the printed circuit board as disclosed in, for example, Japanese Unexamined Patent Publication No. 2002-43752 has heretofore been known in which a plurality of tapered through holes are formed in a thin insulating layer, and these through holes are filled with a plated conductor, and wiring conductors formed from the same plated conductor are respectively formed on upper and lower surfaces of the insulating layer.

In this printed circuit board, however, the plated conductor applied to the inside of the through hole, and the wiring conductors formed on the upper and lower surfaces of the insulating layer are formed from the same plated conductor. Therefore, the formation of the plated conductor thick enough to fill these through holes involves the formation of a thick plated conductor having a thickness of approximately 40 μm on each of the upper and lower surfaces of the insulating layer. This is because the plated conductor, of which thickness is the same as that of the plated conductor deposited inside of the through hole for applying to the inside of the through hole, is deposited on each of the upper and lower surfaces of the insulating layer at the same time. Thus, when the plated conductor formed on each of the upper and lower surfaces of the insulating layer has a thickness of approximately 40 μm, it is necessary to set so that the width of the wiring conductor, which is in the direction parallel to the upper and lower surfaces of insulating layer and is also perpendicular to the direction the wiring conductor extends, formed from the plated conductor is approximately 50 μm, and the spatial interval between the adjacent wiring conductors is approximately 60 μm in consideration of the plated conductor thickness and an anchor depth. It is therefore difficult to arrange the wiring conductors having a smaller width than approximately 50 μm at narrower spatial intervals than approximately 60 μm.

Consequently, the conventional method of manufacturing the printed circuit board is not capable of achieving the thin type printed circuit board having high density wiring in which, for example, the width of the wiring conductors and the spatial interval between the adjacent wiring conductors are 30 μm or less.

SUMMARY OF THE INVENTION

An object of the present invention is to provide a method of manufacturing a thin type printed circuit board having high density wiring. The method includes filling a through hole formed in a thin insulating layer with a plated conductor; and forming a plurality of wiring conductors formed from the plated conductor on upper and lower surfaces of the insulating layer, in which a width of each of the wiring conductors, and a spatial interval between the adjacent wiring conductors are 30 μm or less.

The manufacturing method of the present invention includes forming the through hole in the insulating layer having upper and lower surfaces so as to penetrate between the upper and lower surfaces; forming a first plated conductor at least in the through hole and on the upper and lower surfaces around the through hole; removing the first plated conductor overlying and underlying a periphery of the through hole by etching the first plated conductor, while leaving at least the first plated conductor existing in a mid-portion in a vertical direction within the through hole; and forming by semi-additive method a second plated conductor that fills an outer portion than the first plated conductor in the through hole, and forms a wiring conductor on the upper and lower surfaces.

According to the manufacturing method of the present invention, the thickness of the wiring conductors on the upper and lower surfaces of the insulating layer can be made as thin as 20 μm or less, and hence the micro wiring conductors whose width is 30 μm or less can be formed with high density at spatial intervals of 30 μm or less. It is therefore capable of manufacturing the thin type printed circuit board with the high density wiring.

PREFERRED EMBODIMENTS FOR CARRYING OUT THE INVENTION

An example of the embodiment of the present invention is described with reference to FIGS. 1(a) to 1(h). FIGS. 1(a) to 1(h) show a partial cross section of a region that becomes a printed circuit board. The printed circuit board is actually manufactured by means of multi-production printed circuit boards in which a large number of the regions that become the printed circuit boards are arranged longitudinally and laterally on a large board, and discarding allowance regions are disposed therearound.

Figure 1A:
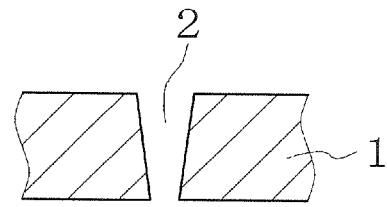
FIGS. 1(a) to 1(h) are process drawings showing an example of an embodiment in the manufacturing method of the present invention.
Figure 1B:
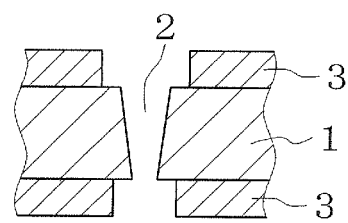
Figure 1C:
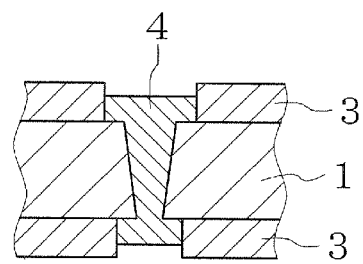
Figure 1D:
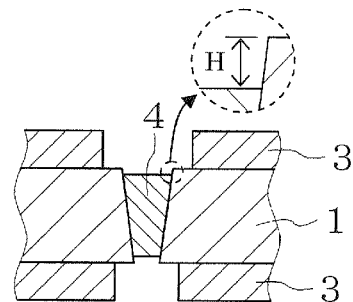
Figure 1E:
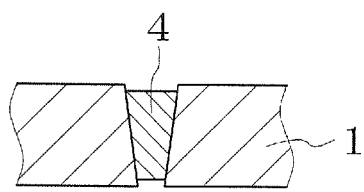
Figure 1F:
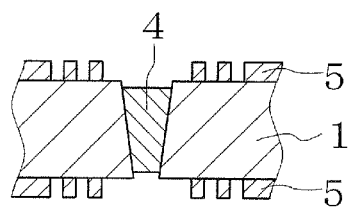
Figure 1G:
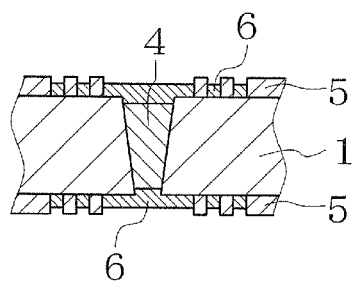
Figure 1H:
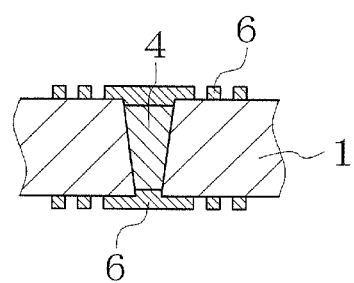

Firstly, as shown in FIG. 1(a), the through hole 2 is formed in the insulating layer 1 having an upper surface and a lower surface so as to extend from the upper surface to the lower surface.

The insulating layer 1 is composed of, for example, an electrical insulation material in which thermosetting resins, such as epoxy resin and bismaleimide-triazine resin, are impregnated in a glass fiber cloth.

The thickness of the insulating layer 1 is approximately 150-250 μm.

The insulating layer 1 is obtained by thermally curing a prepreg having a metal foil with a thickness of approximately 2-18 μm deposited on both surfaces thereof, and then etching away the metal foils on both surfaces of the prepreg.

The prepreg is obtained by impregnating the glass fiber cloth with the thermosetting resins, such as epoxy resin and bismaleimide-triazine resin, followed by semi-curing.

The surface of each of the metal foils to be deposited on the insulating layer 1 is preferably a micro uneven surface. This makes it possible to form micro uneven portions on exposed surfaces of the insulating layer 1, thus allowing the plated conductors to be extremely firmly deposited on the upper and lower surfaces of the insulating layer 1. The metal foils in the discarding allowance regions are left without being etched away. Thereby, the metal foils that remain deposited in the discarding allowance regions can be used as electrodes for connecting a plating apparatus when forming a first plated conductor 4 and a second plated conductor 6 described later.

The through hole 2 is formed by laser processing. An opening diameter of the through hole 2 on a laser incident side surface of the insulating layer 1 is approximately 80-100 μm, and an opening diameter of the through hole 2 on a laser exit side surface of the insulating layer 1 is approximately 30-60 μm. Accordingly, the opening diameter of the through hole 2 on the laser incident side surface of the insulating layer 1 is larger than the opening diameter of the through hole 2 on the laser exit side surface of the insulating layer 1, and the through hole 2 has a tapered shape as shown in FIG. 1(*a*). The tapered shape of the through hole 2 makes it easier to apply the plated conductor to the inside of the through hole 2. After forming the through hole 2, the inner wall of the through hole 2 is preferably subjected to desmear processing.

Subsequently, a thin electroless plating layer (not shown) having a thickness of approximately 0.1-1 μm is deposited on the upper and lower surfaces of the insulating layer 1 and the inner wall of the through hole 2. Thereafter, as shown in FIG. 1(*b*), a plating resist 3 having an opening for exposing the through hole 2 and the upper and lower surfaces of the insulating layer 1 around the through hole 2 is formed on the upper and lower surfaces of the insulating layer 1. The electroless plating layer functions as an underlying metal of the first plated conductor 4 described later. As the electroless plating layer, for example, an electroless copper plating layer is suitably used.

Subsequently, as shown in FIG. 1(*c*), the first plated conductor 4 is deposited by electroplating method in the through hole 2 and on the upper and lower surfaces of the insulating layer 1 around the through hole 2, which are exposed from the plating resist 3, thereby filling the through hole 2 with the first plated conductor 4. At this time, the thickness of the first plated conductor 4 deposited on the upper and lower surfaces of the insulating layer 1 around the through hole 2 is, for example, approximately 40 μm. As the first plated conductor 4, an electrolytic copper plating layer is suitably used.

Subsequently, as shown in FIG. 1(*d*), the first plated conductor 4 exposed in the opening of the plating resist 3 is etched to remove the first plated conductor 4 overlying and underlying a periphery of the through hole 2, and partially remove the first plated conductor 4 applied to the inside of the through hole 2, while leaving at least the first plated conductor 4 existing in the mid-portion in the vertical direction within the through hole 2.

The surface of the first plated conductor 4 remaining in the through hole 2 without being etched away is preferably inner than the upper surface of the insulating layer 1, and a distance H therebetween is preferably approximately 5-40 μm. Similarly, the surface of the first plated conductor 4 remaining in the through hole 2 without being etched away is preferably inner than the lower surface of the insulating layer 1, and a distance therebetween is preferably approximately 5-40 μm. When the distance between the surface of the first plated conductor 4 remaining in the through hole 2 and the upper surface or lower surface of the insulating layer 1 is shorter than 5 μm, there is a risk that the first plated conductor 4 formed on the upper and lower surfaces of the insulating layer 1 is not completely removed, failing to form a micro wiring conductor. On the other hand, when the distance is longer than 40 μm, there is a risk in the manufacturing step described later. That is, a second plated conductor 6 is applied to the etched-away portion of the first plated conductor 4 in the through hole 2, and therefore, the thickness of the second plated conductor 6 deposited on the upper and lower surfaces of the insulating layer 1 exceeds 20 μm. This makes it difficult to form the micro wiring conductors.

Subsequently, as shown in FIG. 1(*e*), the plating resist 3 is removed from the upper and lower surfaces of the insulating layer 1, and a thin electroless plating layer (not shown) having a thickness of approximately 0.1-1 μm is deposited at least on the surface from which the first plated conductor 4 has been removed. This electroless plating layer functions as the underlying metal of the second plated conductor 6 described later, together with the foregoing electroless plating layer. As this electroless plating layer, for example, an electroless copper plating layer is suitably used.

Subsequently, as shown in FIG. 1(*f*), a plating resist 5 having an opening pattern corresponding to the wiring conductor pattern is formed on the upper and lower surfaces of the insulating layer 1. The opening pattern of the plating resist 5 includes a pattern on which the wiring conductor width and the spatial interval between the adjacent wiring conductors are 30 μm or less.

Subsequently, as shown in FIG. 1(*g*), the second plated conductor 6 is deposited by electroplating method on the surfaces of the insulating layer 1 and the first plated conductor 4, which are exposed from the opening pattern of the plating resist 5. That is, the etched-away portion of the first plated conductor 4 in the through hole 2 is filled with the second plated conductor 6, and the second plated conductor 6 is formed to have a thickness of approximately 10-20 μm on the upper and lower surfaces of the insulating layer 1. In this case, the first plated conductor 4 remains in the mid-portion in the vertical direction within the through hole 2 without being etched away. It is therefore only necessary to allow the second plated conductor 6 to be deposited with such a thickness as to fill the etched-away portion of the first plated conductor 4 in the through hole 2. This makes it possible to form the thin second plated conductor 6 having a thickness of 10-20 μm on the upper and lower surfaces of the insulating layer 1. As the second plated conductor 6, for example, an electrolytic copper plating layer is suitably used.

Finally, as shown in FIG. 1(*h*), the plating resist 5 is removed from the upper and lower surfaces of the insulating layer 1, and the electroless plating layer (not shown) exposed from the second plated conductor 6 is etched away. This completes the printed circuit board in which the interior of the through hole 2 is filled with the first plated conductor 4 and the second plated conductor 6, and the wiring conductors formed from the second plated conductor 6 is formed on the upper and lower surfaces of the insulating layer 1. The method of forming the wiring conductor formed from the second plated conductor 6 is called semi-additive process. The semi-additive process is a method of forming the wiring conductor by allowing the second plated conductor 6 having a pattern corresponding to the wiring conductor to be selectively deposited on the electroless plating layer that is the underlying metal, followed by etching away the underlying electroless plating layer exposed from the second plated conductor 6. Hence, there is no probability that the second plated conductor 6 forming the wiring conductor is considerably etched away. Therefore, according to the semi-additive process, micro width wiring conductors can be formed, and the adjacent wiring conductors can be arranged at micro spatial intervals. In the present example, the second plated conductor 6 on the upper and lower surfaces of the insulating layer 1 is as thin as 20 μm or less, and the wiring conductors formed from the second plated conductor 6 are formed by the semi-additive process. Therefore, the micro wiring conductors having a width of 30 μm or less can be formed with high density at spatial intervals of 30 μm or less, thereby manufacturing the thin type printed circuit board with high density wiring.

Next, another example of the embodiment in the manufacturing method of the present invention is described with reference to FIGS. 2(a) to 2(h). Similarly to FIGS. 1(a) to 1(h), FIGS. 2(a) to 2(h) show a partial cross section of a printed circuit board. The printed circuit board is actually manufactured by means of multi-production printed circuit boards on which a large number of the regions that become the printed circuit board are arranged longitudinally and laterally on a large board, and discarding allowance regions are disposed therearound. In this example, portions similar to those in the foregoing example are identified by the same reference numerals, and the details description thereof is omitted for the sake of avoiding complication.

Figure 2A:
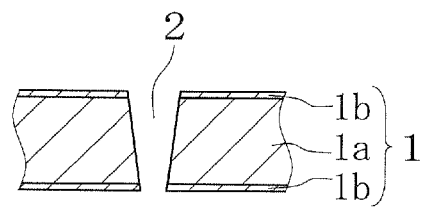
FIGS. 2(a) to 2(h) are process drawings showing another example of the embodiment in the manufacturing method of the present invention.

Firstly, as shown in FIG. 2(a), a through hole 2 is formed in an insulating layer 1 having upper and lower surfaces so as to extend from the upper surface to the lower surface. The insulating layer 1 is comprised of a core layer 1a having a thickness of approximately 150-250 μm, and a primer resin layer 1b having a thickness of 4-7 μm deposited on the upper and lower surfaces of the core layer 1a.

The core layer 1a is composed of an electrical insulation material in which thermosetting resins, such as epoxy resin and bismaleimide-triazine resin, are impregnated in a glass fiber cloth.

The primer resin layer 1b is composed of thermosetting resin, such as epoxy resin, which can be microroughened with roughening fluid. In this example, the upper and lower surfaces of the insulating layer 1 are formed from the primer resin layer 1b. Therefore, the surface of the primer resin layer 1b can be chemically microroughened, and an extremely micro wiring conductor having a width of, for example, 20 μm or less, and furthermore 15 μm or less, can be formed at spatial intervals of, for example, 20 μm or less, or furthermore 15 μm or less on the roughened surface.

The insulating layer 1 having the primer resin layer 1b on the upper and lower surfaces thereof is obtained as follows. That is, the uncured primer resin layer 1b with a metal foil, on which the metal foil having a thickness of approximately 2-18 μm is deposited on one surface of the uncured primer resin layer, is stacked on both surfaces of a prepreg for the core layer 1a so that the metal foil side is oriented outwards. This is then thermally cured. Thereafter, the metal foils on both surfaces are etched away.

The prepreg for the core layer 1a is obtained by impregnating thermosetting resins, such as epoxy resin and bismaleimide-triazine resin, into a glass fiber cloth, followed by semicuring.

The surface of the metal foil to be deposited on the primer resin layer 1b is preferably a smooth surface. This imparts a smooth surface to the surface of the primer resin layer 1b. Then, an extremely microroughened surface can be formed on the surface of the primer resin layer 1b by chemically roughening the smooth surface.

Therefore, the plated conductor can be firmly deposited in an extremely micro pattern on the roughened surface. Similarly to the foregoing example, the through hole 2 is formed by laser processing.

Subsequently, the surface of the primer resin layer 1b is roughened to obtain an extremely microroughened surface whose arithmetic mean roughness Ra is approximately 200-600 nm by treating it with, for example, a desmear liquid containing potassium permanganate.

Figure 2B:
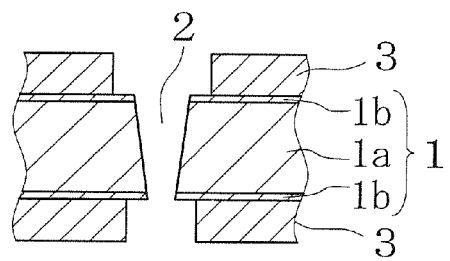

Thereafter, a thin electroless plating layer (not shown) having a thickness of approximately 0.1-1 μm is deposited on the upper and lower surfaces of the insulating layer 1 and on the inner wall of the through hole 2. Then, as shown in FIG. 2(b), a plating resist 3 having an opening for exposing the through hole 2 and the upper and lower surfaces of the insulating layer 1 around the through hole 2 is formed on the upper and lower surfaces of the insulating layer 1.

Figure 2C:
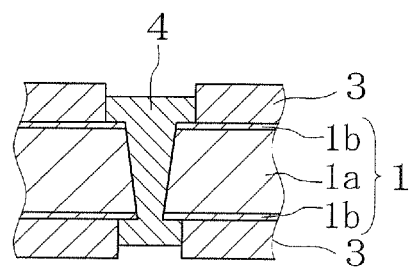

Subsequently, as shown in FIG. 2(c), a first plated conductor 4 is deposited by electroplating method in the through hole 2 and on the upper and lower surfaces of the insulating layer 1 around the through hole 2, which are exposed from the plating resist 3, thereby filling the interior of the through hole 2 with the first plated conductor 4.

Figure 2D:
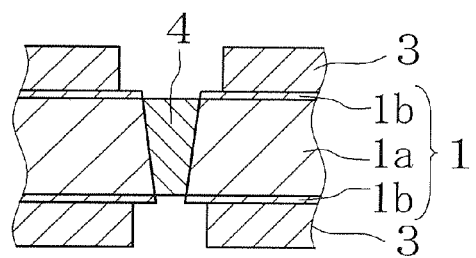

Subsequently, as shown in FIG. 2(d), the first plated conductor 4 exposed in the opening of the plating resist 3 is etched to remove the first plated conductor 4 overlying and underlying a periphery of the through hole 2, and partially remove the first plated conductor 4 applied to the inside of the through hole, while leaving at least the first plated conductor 4 existing in the mid-portion in a vertical direction within the through hole 2.

Figure 2E:
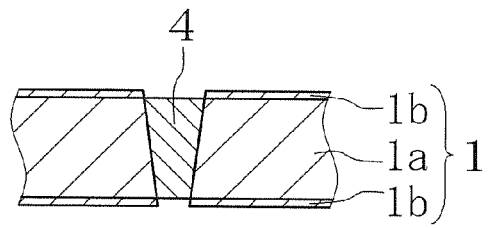

Subsequently, as shown in FIG. 2(e), the plating resist 3 formed on the upper and lower surfaces of the insulating layer 1 is removed, and a thin electroless plating layer (not shown) having a thickness of approximately 0.1-1 μm is deposited at least on the surface from which the first plated conductor 4 has been removed.

Figure 2F:
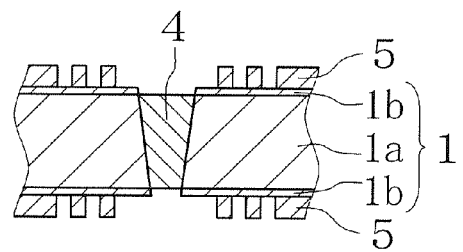

Subsequently, as shown in FIG. 2(f), a plating resist 5 having an opening pattern corresponding to the wiring conductor pattern is formed on the upper and lower surfaces of the insulating layer 1.

Figure 2G:
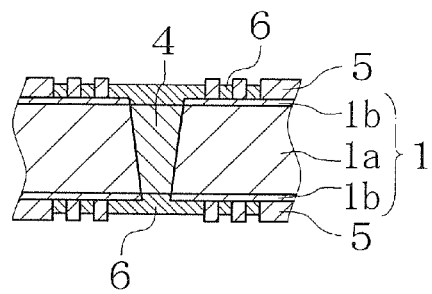

Subsequently, as shown in FIG. 2(g), a second plated conductor 6 is deposited by electroplating method on the surfaces of the insulating layer 1 and the first plated conductor 4, which are exposed from the opening pattern of the plating resist 5. The second plated conductor 6 fills the etched-away portion of the first plated conductor 4 in the through hole 2, and is formed in a thickness of approximately 10-20 μm on the upper and lower surfaces of the insulating layer 1.

In this case, the first plated conductor 4 already exists in the mid-portion in the vertical direction within the through hole 2. It is therefore only necessary to allow the second plated conductor 6 to be deposited in such a thickness as to fill only the etched-away portion of the first plated conductor 4 in the through hole 2. Accordingly, the thin second plated conductor 6 having a thickness of 10-20 μm can be formed on the upper and lower surfaces of the insulating layer 1.

Figure 2H:
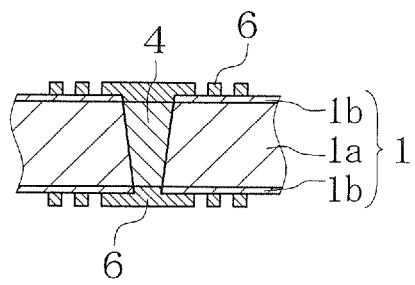

Finally, as shown in FIG. 2(h), the plating resist 5 is removed from the upper and lower surfaces of the insulating layer 1, and the electroless plating layer (not shown) exposed from the second plated conductor 6 is etched away. This completes the printed circuit board in which the interior of the through hole 2 is filled with the first plated conductor 4 and the second plated conductor 6, and the wiring conductor formed from the second plated conductor 6 is formed on the primer resin layer 1b on the upper and lower surfaces of the insulating layer 1. Also in this example, the second plated conductor 6 formed on the upper and lower surface of the insulating layer 1 is as thin as 20 μm or less, and the wiring conductor formed from the second plated conductor 6 is formed by the semi-additive process. Therefore, the micro wiring conductors whose width is 20 μm or less can be formed with high density at spatial intervals of 20 μm or less, thereby manufacturing the thin type printed circuit board with high density wiring.

Further, in the present example, the surface of the primer resin layer 1b is turned into an extremely microroughened surface whose arithmetic mean roughness Ra is approximately 200-600 nm, and hence it does not take a long time to etch away the electroless plating layer that has penetrated into micro recesses in the roughened surface. It is therefore capable of forming wiring conductors of a further micro pattern at further microspatial intervals. This makes it possible to provide the thin printed circuit board having the extremely micro wiring conductors with high density, which have, for example, a width of 12 μm and spatial intervals of approximately 13 μm.

Next, yet another example of the embodiment in the manufacturing method of the present invention is described with reference to FIGS. 3(a) to 3(h). Similarly to FIGS. 1(a) to 1(h) and FIGS. 2(a) to 2(h), FIGS. 3(a) to 3(h) show only a partial cross section of a region that becomes a printed circuit board. The printed circuit board is actually manufactured by means of multi-production printed circuit boards on which a large number of the regions that become the printed circuit board are arranged longitudinally and laterally on a large board, and discarding allowance regions are disposed therearound. In this example, portions similar to those in the foregoing one or another example are identified by the same reference numerals, and the details description thereof is omitted for the sake of avoiding complication.

Figure 3A:
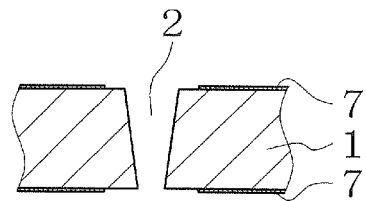
FIGS. 3(a) to 3(h) are process drawings showing yet another example of the embodiment in the manufacturing method of the present invention.

Firstly, as shown in FIG. 3(a), a through hole 2 is formed in an insulating layer 1 having metal foils 7 deposited on upper and lower surfaces thereof so as to extend from the upper surface to the lower surface. Openings for exposing the through hole 2 and the upper and lower surfaces of the insulating layer 1 around the through hole 2 are previously formed in the metal foils 7 by etching.

The insulating layer 1 is composed of an electrical insulation material in which thermosetting resins, such as epoxy resin and bismaleimide-triazine resin, are impregnated in a glass fiber cloth. The insulating layer 1 has a thickness of approximately 40-250 μm. For example, the metal foils 7 are formed from copper foil, and have a thickness of approximately 2-8 μm.

The insulating layer 1 with the metal foils 7 are obtained in the following manner. That is, a prepreg with a metal foil having a thickness of approximately 2-8 μm deposited on both surfaces of the prepreg is thermally cured, and thereafter, these metal foils are partially etched. The prepreg is obtained by impregnating thermosetting resins, such as epoxy resin and bismaleimide-triazine resin, into a glass fiber cloth, followed by semicuring. Similarly to the foregoing one or another example, the through hole 2 is formed by laser processing.

Figure 3B:
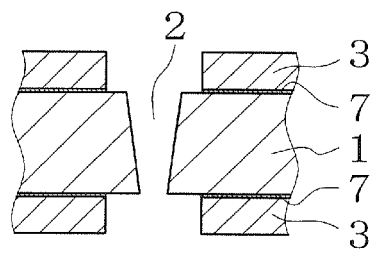

Subsequently, a thin electroless plating layer (not shown) having a thickness of approximately 0.1-1 μm is deposited on the exposed upper and lower surfaces of the insulating layer 1, and on the inner wall of the through hole 2, and on the surfaces of the metal foils 7. Thereafter, as shown in FIG. 3(b), a plating resist 3 having an opening for exposing the through hole 2 and the circumference thereof is formed on the upper and lower metal foils 7.

Figure 3C:
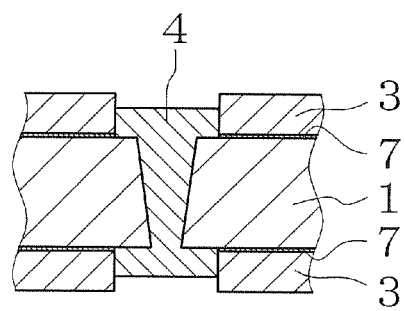

Subsequently, as shown in FIG. 3(c), a first plated conductor 4 is deposited by electroplating method in the through hole 2 and on the upper and lower surfaces of the insulating layer 1 around the through hole 2, which are exposed from the plating resist 3, thereby filling the interior of the through hole 2 with the first plated conductor 4.

Figure 3D:
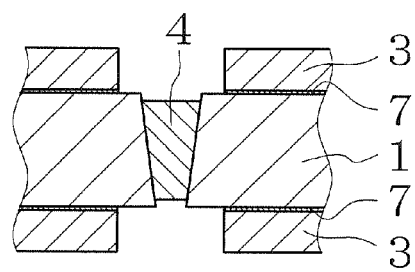

Subsequently, as shown in FIG. 3(d), the first plated conductor 4 exposed in the opening of the plating resist 3 is etched to remove the first plated conductor 4 overlying and underlying a periphery of the through hole 2, and partially remove the plated conductor 4 applied to the inside of the through hole, while leaving at least the first plated conductor 4 existing in the mid-portion in the vertical direction within the through hole 2.

Figure 3E:
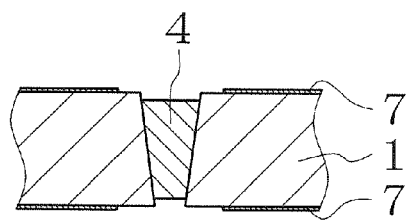

Subsequently, as shown in FIG. 3(e), the plating resist 3 lying on the metal foils 7 is removed, and a thin electroless plating layer (not shown) having a thickness of approximately 0.1-1 μm is deposited at least on the surface from which the first plated conductor 4 has been removed.

Figure 3F:
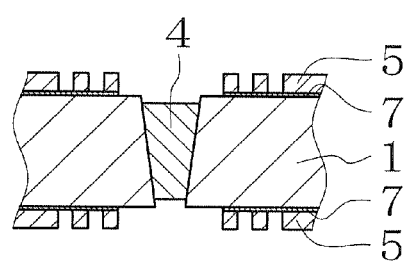

Subsequently, as shown in FIG. 3(f), a plating resist 5 having an opening pattern corresponding to the wiring conductor pattern is formed on the upper and lower metal foils 7.

Figure 3G:
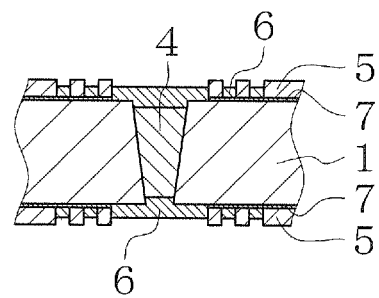

Subsequently, as shown in FIG. 3(g), a second plated conductor 6 is deposited by electroplating method on the insulating layer 1 and on the surfaces of the first plated conductor 4 and the metal foils 7, which are exposed from the opening pattern of the plating resist 5. The second plated conductor 6 fills the etched-away portion of the first plated conductor 4 in the through hole 2, and is formed to have a thickness of approximately 10-20 μm on the upper and lower surfaces of the insulating layer 1 and on the metal foils 7.

In this case, the first plated conductor 4 already exists in the mid-portion in the vertical direction within the through hole 2. It is therefore only necessary to allow the second plated conductor 6 to be deposited in such a thickness as to fill only the etched-away portion of the first plated conductor 4 in the through hole 2. This makes it possible to form the thin second plated conductor 6 having a thickness of 10-20 μm on the upper and lower surfaces of the insulating layer 1, and on the metal foils 7.

Figure 3H:
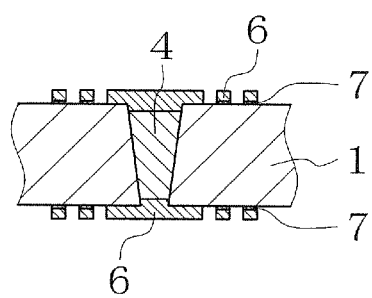

Finally, as shown in FIG. 3(h), the plating resist 5 lying on the metal foils 7 is removed, and the electroless plating layer (not shown) exposed from the second plated conductor 6 and metal foil 7 are etched away. This completes the printed circuit board in which the interior of the through hole 2 is filled with the first plated conductor 4 and the second plated conductor 6, and the wiring conductor formed from the second plated conductor 6 using the metal foil 7 as the underlayer is formed on the upper and lower surfaces of the insulating layer 1. Also in this example, the second plated conductor 6 formed on the upper and lower surfaces of the insulating layer 1 is as thin as 20 μm or less, and the wiring conductor formed from the second plated conductor 6 is formed by the semi-additive process. Therefore, the micro wiring conductors whose width is 30 μm or less can be formed with high density at spatial intervals of 30 μm or less, thereby manufacturing the thin type printed circuit board with high density wiring.

Further, in the present example, the metal foils 7 deposited on the upper and lower surfaces of the insulating layer 1 are used as the underlying metal of the wiring conductor formed from the second plated conductor 6. Consequently, the wiring conductors formed from the second plated conductor 6 can be extremely firmly connected through the metal foils 7 to the upper and lower surfaces of the insulating layer 1.

The present invention is not limited to the foregoing examples of the present embodiment, and various changes can be made thereto. For example, in the foregoing one example or another example, after forming the plating resist 3 for exposing the through hole 2 and the circumference thereof, the interior of the through hole 2 is filled with the first plated conductor 4 by allowing the first plated conductor 4 to be deposited in the through hole 2 exposed from the plating resist 3 and on the upper and lower surfaces of the insulating layer 1 around the through hole 2. Alternatively, the interior of the through hole 2 may be filled with the first plated conductor 4 in the following manner. That is, the through hole 2 is formed in the insulating layer 1, and in this state, namely without disposing the plating resist layer 3, and thereafter the first plated conductor 4 is deposited in the through hole 2 and on the entire upper and lower surfaces of the insulating layer 1. For example, in the yet another example of the foregoing embodiment, the opening for exposing the through hole 2 and the upper and lower surfaces of the insulating layer 1 around the through hole is previously formed in the metal foils 7 by etching, and thereafter the through hole is formed by laser processing. Alternatively, the through hole 2 may be formed in copper foils and the insulating layer 1 by directly irradiating laser from above the metal foils 7 without disposing any opening in the metal foils 7.

The invention claimed is:

1. A method of manufacturing a printed circuit board, comprising:
    forming a through hole in an insulating layer having upper and lower surfaces so as to penetrate between the upper and lower surfaces;
    forming a first plated conductor at least in the through hole and on the upper and lower surfaces around the through hole;
    removing the first plated conductor overlying and underlying a periphery of the through hole by etching the first plated conductor, while leaving the first plated conductor in a mid-portion in a vertical direction within the through hole; and
    forming by semi-additive method a second plated conductor that fills an outer portion than the first plated conductor in the through hole, and forms a wiring conductor on the upper and lower surfaces.

2. The method of manufacturing a printed circuit board according to claim 1, wherein the insulating layer has a primer resin layer on the upper and lower surfaces.

3. The method of manufacturing a printed circuit board according to claim 1, wherein metal foil is deposited as underlying metal of the second plated conductor in the through hole and on the upper and lower surfaces except for circumference of the through hole.

4. The method of manufacturing a printed circuit board according to claim 1, wherein the through hole is formed so that an opening diameter in one surface of the insulating layer is larger than an opening diameter in the other surface of the insulating layer.

5. The method of manufacturing a printed circuit board according to claim 4, wherein the through hole in one surface of the insulating layer has an opening diameter of 80-100 µm, and the through hole in the other surface of the insulating layer has an opening diameter of 30-60 µm.

6. The method of manufacturing a printed circuit board according to claim 1, wherein the through hole is formed by laser processing.

7. The method of manufacturing a printed circuit board according to claim 1, wherein at least upper and lower surfaces of the first plated conductor in a mid-portion in a vertical direction within the through hole are respectively located at a inner position by 5-40 µm than the upper or lower surfaces of the insulating layer.

8. The method of manufacturing a printed circuit board according to claim 2, wherein the surface of the primer resin layer has an arithmetic mean roughness Ra of approximately 200-600 nm.

* * * * *